(12) United States Patent
Jin (10) Patent No.: US 9,018,645 B2
(45) Date of Patent: Apr. 28, 2015

(54) OPTOELECTRONICS ASSEMBLY AND METHOD OF MAKING OPTOELECTRONICS ASSEMBLY

(71) Applicant: STMicroelectronics Pte Ltd., Singapore (SG)

(72) Inventor: Yonggang Jin, Singapore (SG)

(73) Assignee: STMicroelectronics Pte Ltd, Singapore (SG)

( * ) Notice: Subject to any disclaimer, the term of this patent is extended or adjusted under 35 U.S.C. 154(b) by 0 days.

(21) Appl. No.: 14/013,507

(22) Filed: Aug. 29, 2013

(65) Prior Publication Data

US 2015/0060891 A1 Mar. 5, 2015

(51) Int. Cl.
*H01L 31/173* (2006.01)
*H01L 23/00* (2006.01)

(52) U.S. Cl.
CPC .............. *H01L 31/173* (2013.01); *H01L 24/14* (2013.01); *H01L 24/81* (2013.01)

(58) Field of Classification Search
CPC ........ H01L 31/173; H01L 24/14; H01L 24/81
USPC .................. 257/E21.499, E21.502, 737, 774, 257/E23.01, E23.011, 778, E21.508; 438/107, 127, 124, 113, 108, 126, 106, 438/613, 110, 15, 27, 667
See application file for complete search history.

(56) References Cited

U.S. PATENT DOCUMENTS

| | | | |
|---|---|---|---|
| 7,982,226 B2* | 7/2011 | Lee et al. | 257/80 |
| 2009/0206461 A1* | 8/2009 | Yoon | 257/686 |
| 2011/0057129 A1* | 3/2011 | Yao et al. | 250/552 |
| 2012/0305771 A1* | 12/2012 | Lai | 250/338.4 |

* cited by examiner

*Primary Examiner* — Roy Potter
*Assistant Examiner* — Paul Patton
(74) *Attorney, Agent, or Firm* — Gardere Wynne Sewell LLP (57) ABSTRACT

An electronics assembly includes a semiconductor die assembly, an enclosure affixed to the semiconductor die assembly, the enclosure defining first and second chambers over the semiconductor die assembly, and first and second optical elements mounted in the first and second chambers, respectively. The semiconductor die assembly includes a semiconductor die encapsulated in a molded material, an encapsulation layer located on the top surface of the semiconductor die, and at least one patterned metal layer and at least one dielectric layer over the encapsulation layer. Conductive pillars extend through the encapsulation layer for electrical connection to the semiconductor die. The encapsulation layer blocks optical crosstalk between the first and second chambers. A method is provided for making the electronics assembly.

18 Claims, 7 Drawing Sheets

OPTOELECTRONICS ASSEMBLY AND METHOD OF MAKING OPTOELECTRONICS ASSEMBLY

BACKGROUND

1. Technical Field

This disclosure relates to electronic assemblies and to methods of making electronics assemblies. More particularly, the disclosure relates to optoelectronics assemblies which may include a light source and a light sensor, and to methods of making optoelectronics assemblies.

2. Discussion of the Related Art

Various electronics packaging techniques are utilized to achieve miniaturization, environmental protection and high performance. In one example known as a Wafer Level Package (WLP), multiple semiconductor die are encapsulated in a molded material known as a reconstructed wafer. One or more interconnect layers and a ball grid array may be added to the reconstructed wafer. The reconstructed wafer is then divided into individual electronics assemblies, each of which may be mounted in electronics equipment and electrically connected via the ball grid array.

In some applications, the wafer level packaging technique may be utilized for making an electronics assembly including optical elements, such as a light source and a light sensor. One example is an optical proximity sensor where a light beam is transmitted by the proximity sensor. An object in the path of the light beam reflects the light beam to the light sensor. A change in light level detected by the sensor indicates the presence of the object. In such an electronics assembly, the light source and the light sensor are mounted in separate chambers so that the light sensor detects the light reflected from the object but does not detect light from the light source itself.

It is commonplace in semiconductor processing to form a passivation layer on the top surface of a semiconductor die package. The passivation layer is transparent. If the semiconductor die is positioned below both chambers of the optoelectronics assembly, the passivation layer may provide a path for undesired optical crosstalk between chambers. Such crosstalk may cause the optoelectronics assembly to provide erroneous results. In particular, light from the light source may leak into the light sensor chamber and be detected. Accordingly, there is a need for improved electronics assemblies and methods of making electronics assemblies.

SUMMARY

One or more of the above disadvantages are overcome by electronics assemblies and methods of making electronics assemblies in accordance with various embodiments. An electronics assembly in accordance with embodiments includes a semiconductor die assembly, an enclosure affixed to the semiconductor die assembly, the enclosure defining first and second chambers over the semiconductor die assembly, and first and second optical elements mounted in the first and second chambers, respectively. The semiconductor die assembly includes a semiconductor die encapsulated in a molded material, an encapsulation layer located on the top surface of the semiconductor die, and at least one patterned metal layer and at least one dielectric layer over the encapsulation layer. Conductive pillars may extend through the encapsulation layer for electrical connection to the semiconductor die. The conductive pillars are preferably copper pillars, but are not limited to copper pillars. The encapsulation layer blocks optical crosstalk between the first and second chambers.

According to one embodiment, a method is provided for making an electronics assembly, comprising forming one or more conductive pillars on a top surface of a semiconductor die, placing the semiconductor die on a carrier tape such that the semiconductor die is spaced from the carrier tape by the conductive pillars, encapsulating the semiconductor die in a molded material, such that an encapsulation layer is located between the semiconductor die and the carrier tape and surrounds the conductive pillars, to form a semiconductor die assembly, removing the semiconductor die assembly from the carrier tape and forming an enclosure defining first and second chambers over the semiconductor die assembly, the enclosure including a wall between the first and second chambers, and mounting first and second optical elements in the first and second chambers, respectively, with the first and second optical elements electrically connected to the semiconductor die.

In some embodiments, the encapsulation layer is formed during encapsulation of the semiconductor die in the molded material. In other embodiments, the encapsulation layer is formed on the semiconductor die after forming the one or more conductive pillars and before encapsulating the semiconductor die in the molded material.

In some embodiments, the conductive pillars are formed with a specified pillar height above the top surface of the semiconductor die and the encapsulation layer has a thickness equal to the pillar height. The first and second optical elements may be electrically connected to the semiconductor die by the conductive pillars.

In some embodiments, the first optical element comprises a light source and the second optical element comprises a light sensor. The semiconductor die may comprise an image sensor processor.

In some embodiments, the enclosure includes a first lens positioned over the first optical element and a second lens positioned over the second optical element. A first portion of the semiconductor die may be located under the first chamber and a second portion of the semiconductor die may be located under the second chamber.

In some embodiments, the method further comprises forming at least one patterned metal layer and at least one dielectric layer over the encapsulated semiconductor die. An opening may be formed in the dielectric layer, and the wall between the first and second chambers may extend into the opening in the dielectric layer.

According to another embodiment, an electronics assembly comprises a semiconductor die assembly including a semiconductor die encapsulated in a molded material, one or more conductive pillars on a top surface of the semiconductor die, an encapsulation layer located on the top surface of the semiconductor die and surrounding the conductive pillars, and at least one patterned metal layer and at least one dielectric layer over the encapsulation layer. The electronics assembly further comprises an enclosure affixed to the semiconductor die assembly, the enclosure defining first and second chambers over the semiconductor die assembly and including a wall between the first and second chambers, and first and second optical elements mounted in the first and second chambers, respectively, and electrically connected to the semiconductor die.

According to another embodiment, a semiconductor die assembly comprises a semiconductor die encapsulated in a molded material, one or more conductive pillars on a top surface of the semiconductor die, an encapsulation layer located on the top surface of the semiconductor die and surrounding the conductive pillars, and at least one patterned metal layer and at least one dielectric layer over the encapsulation layer.

BRIEF DESCRIPTION OF DRAWINGS

For a better understanding of the embodiments, reference is made to the accompanying drawings, which are incorporated herein by reference and in which.

DETAILED DESCRIPTION

Figure 1A:
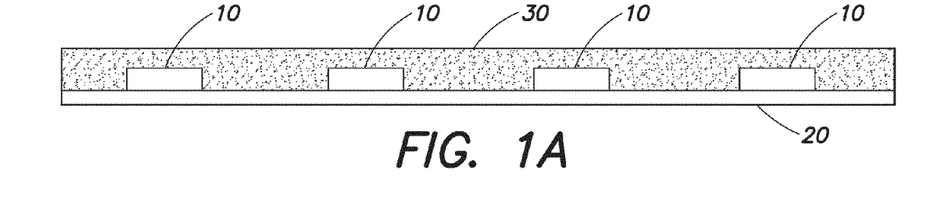
FIGS. 1A-1C illustrate a process for making a wafer level package.
Figure 1B:
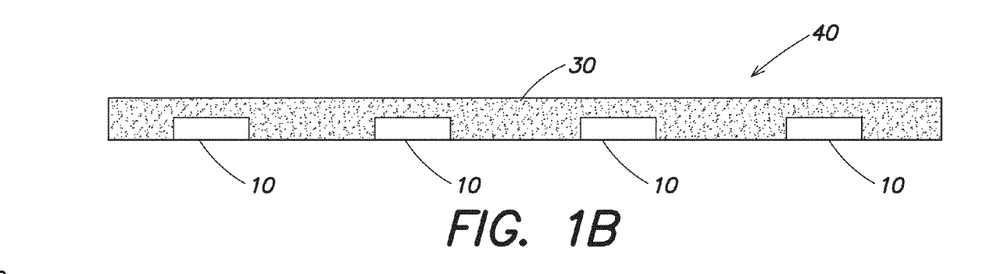
Figure 1C:
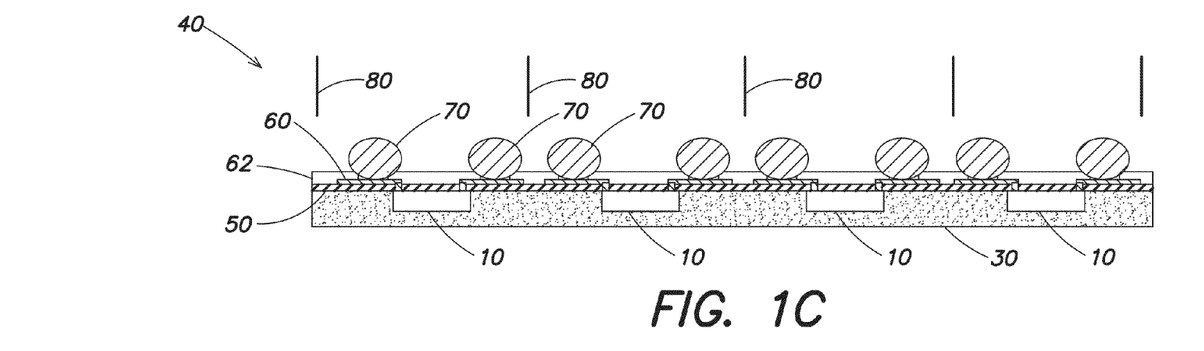

A process for making a wafer level package is shown in FIGS. 1A-1C. As shown in FIG. 1A, multiple semiconductor die 10 are placed on a temporary carrier tape 20, or release tape, with the semiconductor die 10 facing downwardly toward the carrier tape 20. Then, the semiconductor die 10 are encapsulated in a molded material 30, such as a curable resin.

Referring to FIG. 1B, the carrier tape 20 is removed after the encapsulation process, thereby leaving the semiconductor die 10 encapsulated in molded material 30. The molded material 30 containing semiconductor die 10 may be considered a "reconstructed wafer 40". The reconstructed wafer 40 may, for example, have a circular shape containing a two-dimensional array of semiconductor die 10 encapsulated in molded material 30.

Referring to FIG. 1C, a dielectric layer 50 and a patterned metal layer 60 are formed on a top surface of reconstructed wafer 40. The patterned metal layer 60 provides electrical connections to each of the semiconductor die 10. In some embodiments, more than one dielectric layer 50 and more than one patterned metal layer 60 may be utilized. Solder balls 70 are then formed on the patterned metal layer 60 and provide electrical connections to semiconductor die 10. As shown in FIG. 1C, the spacing of solder balls 70 may be different from the spacing of electrical contacts on semiconductor die 10. This arrangement provides a "fan-out," or increased area, of electrical connections.

As further shown in FIG. 1C, the reconstructed wafer 40 is then separated into individual electronic assemblies, such as the electronic assemblies shown in FIGS. 2 and 3 and described below. The electronic assemblies may be separated from each other by sawing with a cutting blade 80, using conventional circuit sawing techniques, or by laser cutting.

A passivation layer 62 is formed over patterned metal layer 60 and is patterned to form openings in which the solder balls 70 are located.

Figure 2:
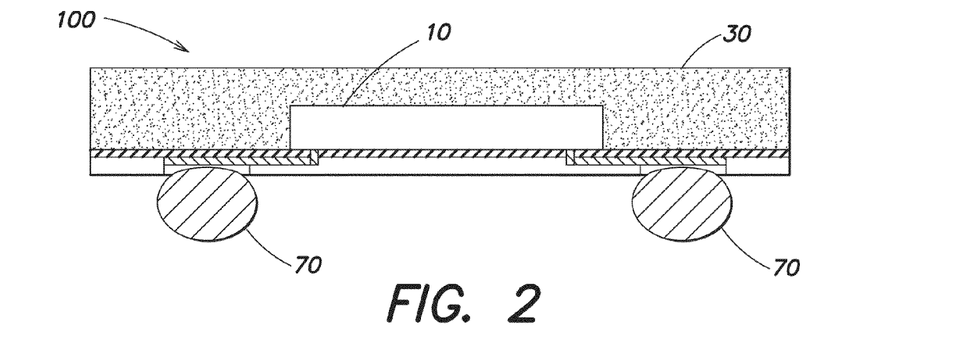
FIG. 2 is a cross-sectional view of a single-sided wafer level package.

A separated electronics assembly 100 is shown in FIG. 2. The electronics assembly 100 of FIG. 2 is single-sided, since all electrical connections are on the bottom surface, and in particular are formed by solder balls 70.

Figure 3:
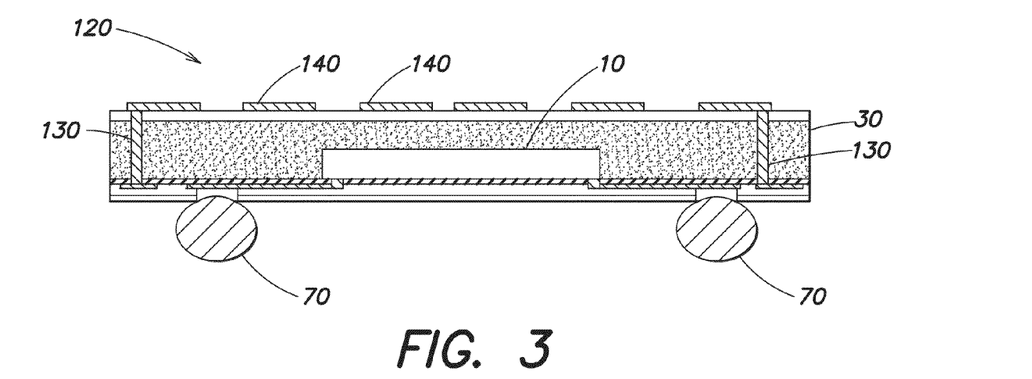
FIG. 3 is a cross-sectional view of a double-sided wafer level package.

A separated electronics assembly 120 is shown in FIG. 3. The electronics assembly 120 has electrical connections on its top and bottom surfaces and therefore is double-sided. In particular, conductive vias 130 extend through the molded material 30 from the bottom surface to the top surface, and conductive contacts 140 are formed on the top surface of electronics assembly 120. Thus, the electronics assembly 120 may be electrically connected to other circuitry at its top and bottom surfaces.

Figure 4:
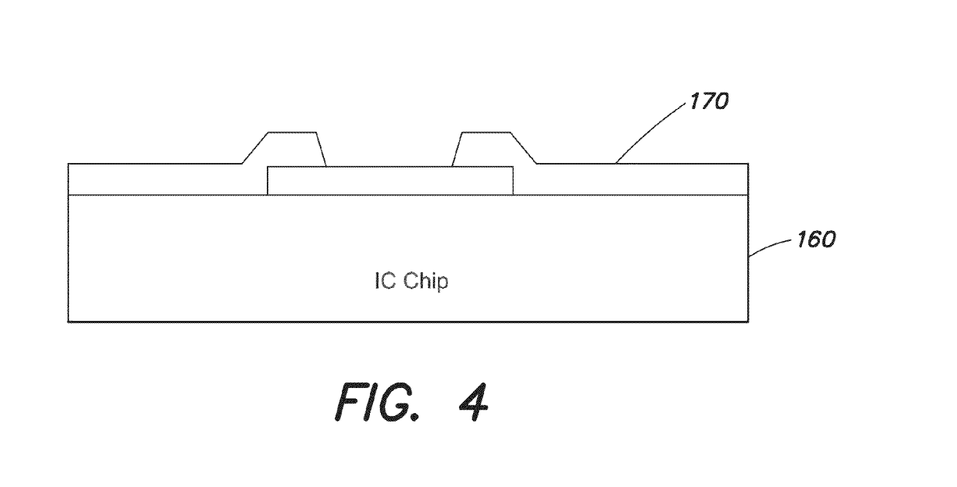
FIG. 4 is a schematic diagram of a semiconductor die having a transparent passivation layer that can produce optical crosstalk.

A schematic diagram that illustrates a semiconductor die having a transparent passivation layer is shown in FIG. 4. A semiconductor die 160 is covered with a transparent passivation layer 170. Transparent passivation layer 170 provides a path for light leakage between elements of an optical assembly, thereby producing optical crosstalk. Such optical crosstalk is unacceptable in highly sensitive optoelectronics assemblies.

Figure 5:
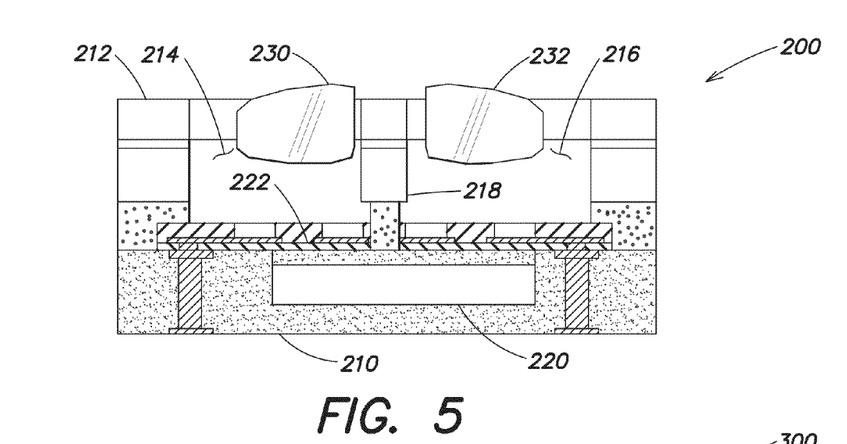
FIG. 5 is a cross-sectional diagram of an electronics assembly wherein a transparent passivation layer produces optical crosstalk between chambers.

Optical crosstalk is further illustrated in FIG. 5, which shows a cross-sectional diagram of an electronics assembly 200. The electronics assembly 200 includes a semiconductor die assembly 210 and an enclosure 212 affixed to a top surface of the semiconductor die assembly 210. Enclosure 212 defines a first chamber 214 and a second chamber 216 over the semiconductor die assembly 210. The enclosure 212 includes a wall 218 between the first chamber 214 and the second chamber 216. The semiconductor die assembly 210 includes a semiconductor die 220 covered with a transparent passivation layer 222. As shown, semiconductor die 220 is located under both the first chamber 214 and the second chamber 216. Thus, light entering first chamber 214 or generated within first chamber 214 can pass through transparent passivation layer 222 to second chamber 216, thereby producing optical crosstalk. Similarly, light can pass from second chamber 216 through transparent passivation layer 222 to first chamber 214. As indicated above, such optical crosstalk is unacceptable.

Figure 6:
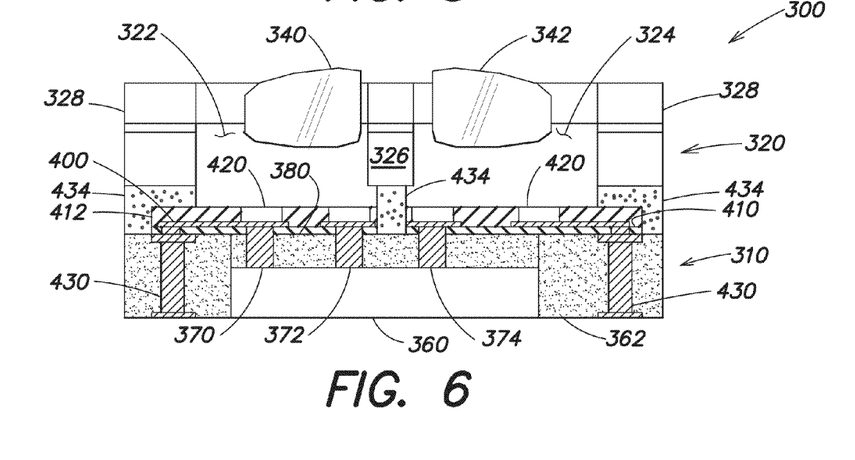
FIG. 6 is a cross-sectional diagram of an electronics assembly in accordance with embodiments.

A cross-sectional diagram of an electronics assembly in accordance with embodiments is shown in FIG. 6. An electronics assembly 300 includes a semiconductor die assembly 310 and an enclosure 320 affixed to a top surface of the semiconductor die assembly 310. Enclosure 320 defines a first chamber 322 and a second chamber 324 over the semiconductor die assembly 310. The enclosure 320 includes a dividing wall 326 between the first chamber 322 and the second chamber 324. The enclosure 320 further includes an outer wall 328 that encloses first chamber 322 and second chamber 324. Optical elements (not shown in FIG. 6) may be mounted in the first and second chambers 322, 324 as discussed below. The enclosure 320 may include a first lens 340 mounted above first chamber 322 and a second lens 342 mounted above second chamber 324. As discussed below, the first chamber 322 is optically isolated from the second chamber 324, at least in the operating wavelength range of electronics assembly 300.

As shown in FIG. 6, the semiconductor die assembly 310 includes a semiconductor die 360 encapsulated in a molded material 362. The semiconductor die 360 may be encapsulated in molded material 362 as described above in connection with FIGS. 1A-1C. The semiconductor die assembly 310 further includes conductive pillars 370, 372, 374, which are affixed to contact pads on a top surface of semiconductor die 360 and which extend upwardly from semiconductor die 360.

The semiconductor die assembly 310 further includes an encapsulation layer 380 on the top surface of semiconductor die 360. The encapsulation layer 380 surrounds and contacts conductive pillars 370, 372, 374, so as to prevent light leakage along the conductive pillars. The conductive pillars 370, 372, 374 have a specified pillar height above semiconductor die 360, which establishes the thickness of the encapsulation layer 380. In particular, the thickness of the encapsulation layer 380 may be the same as or slightly less than the height of conductive pillars 370, 372, 374, so as to expose the conductive pillars for electrical contact. The top surface of encapsulation layer 380 and molded material 362 may be coplanar to provide a surface for formation of additional layers of the semiconductor die assembly.

As further shown in FIG. 6, the semiconductor die assembly 310 includes a patterned metal layer 400, a first dielectric layer 410 and a second dielectric layer 412. The first dielectric layer 410 is formed on encapsulation layer 380 and molded material 362. The patterned metal layer 400 is formed over first dielectric layer 410, and second dielectric layer 412 is formed over patterned metal layer 400. Electrical contacts 420 may be formed in dielectric layer 412. The conductive pillars 370, 372, 374, the patterned metal layer 400 and the electrical contacts 420 provide electrical connections between semiconductor die 360, optical elements 330 and 332 (FIG. 7), and external circuitry (not shown). It will be understood that the semiconductor die assembly 310 may include additional patterned metal layers and additional dielectric layers.

As further shown in FIG. 6, the semiconductor die assembly 310 may include conductive vias 430 that interconnect the patterned metal layer 400 to contacts on a bottom surface of molded material 362. The conductive vias 430 provide additional flexibility in interconnecting the semiconductor die assembly 310 to external circuitry.

As shown schematically in FIG. 6, first chamber 322 is separated from second chamber 324 by wall 326. A first portion 440 of semiconductor die 360 is located under first chamber 322, and a second portion 442 of semiconductor die 360 is located under second chamber 324. The semiconductor die 360 may have a transparent passivation layer on its upper surface. The transparent passivation layer can potentially provide a path for light leakage between first chamber 322 and second chamber 324. However, the encapsulation layer 380 blocks incident light in either chamber from reaching the passivation layer on the top surface of semiconductor die 360. The encapsulation layer 380 is selected to be opaque to radiation in the operating wavelength range of the electronics assembly.

As further shown in FIG. 6, the enclosure 320 is affixed to semiconductor die assembly 310 by an adhesive glue 434. The adhesive glue 434 is selected to be opaque to radiation in the operating wavelength range of the electronics assembly. The adhesive glue 434 surrounds the outer edges of dielectric layers 410 and 412 so that the dielectric layers 410 and 412 do not extend to the outer periphery of the electronics assembly 300. This configuration avoids light leakage through dielectric layers 410, 412 into first chamber 322 and second chamber 324. Further, the adhesive glue 434 below wall 326 extends into an opening in dielectric layers 410 and 412 and abuts a top surface of encapsulation layer 380. This arrangement prevents light leakage under wall 326 between first chamber 322 and second chamber 324.

Figure 7:
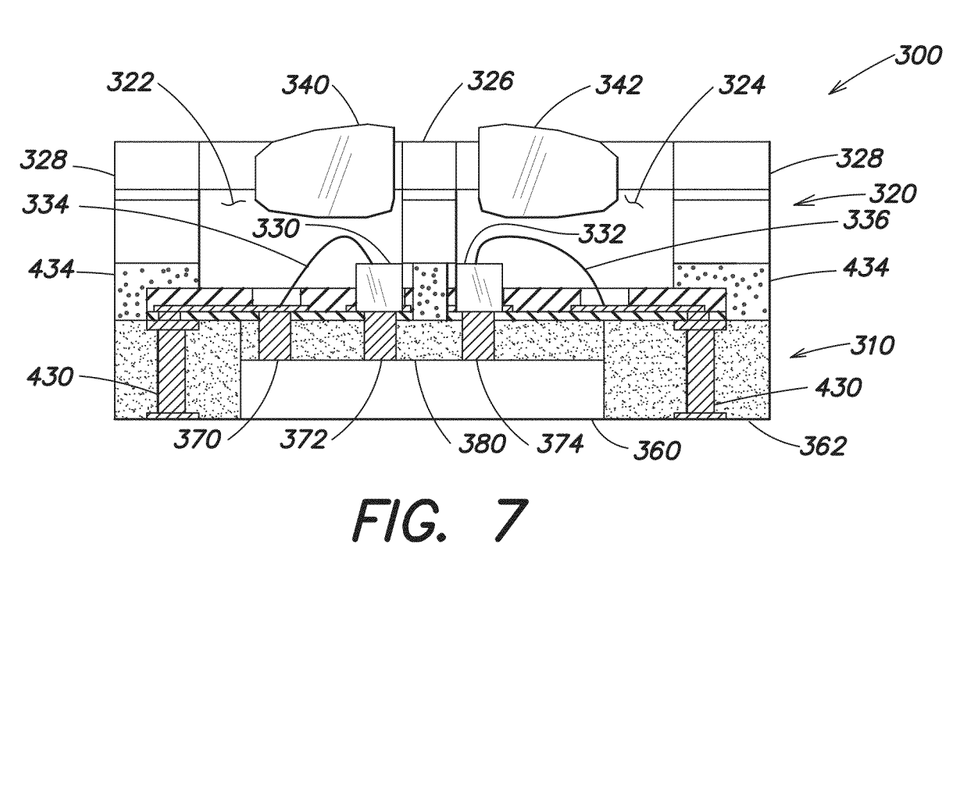
FIG. 7 is a cross-sectional diagram of a completed electronics assembly in accordance with embodiments.

A completed electronics assembly 300 in accordance with embodiments of the invention is shown in FIG. 7. Like elements in FIGS. 6 and 7 have the same reference numerals. As shown in FIG. 7, a first optical element 330 is mounted in first chamber 322, and a second optical element 332 is mounted in second chamber 324. The first optical element 330 is electrically connected via conductive pillar 372 to semiconductor die 360 and is electrically connected via a wire 334 and conductive pillar 370 to semiconductor die 360. The second conductive element 332 is electrically connected via conductive pillar 374 to semiconductor die 360 and is electrically connected via a wire 336 to conductive via 430.

In some embodiments, the electronics assembly 300 shown in FIGS. 6 and 7 and described above may be an optical proximity sensor. In such embodiments, the first optical element 330 may be a light source, such as a light-emitting diode (LED) or laser diode, and the second optical element 332 may be a light sensor, such as a photosensor. The semiconductor die 360 may be an image sensor processor which energizes and controls light source 330 and light sensor 332 and provides output signals to external circuitry. The light source 330 may transmit a light beam through first lens 340 to a region of interest. In the absence of an object in the region of interest, the light beam is not reflected. However, when an object enters the region of interest, the light beam is reflected through second lens 342 and is detected by light sensor 332. The light sensor 332 provides a signal to image sensor processor 360, which in turn provides to external circuitry a signal indicative of object detection.

Figure 8A:
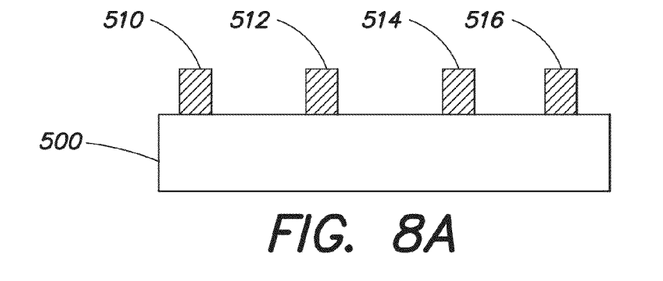
FIGS. 8A-8D illustrate a process for making a semiconductor die assembly in accordance with embodiments.

FIGS. 8A-8D illustrate a process for making a semiconductor die assembly in accordance with embodiments of the invention. As shown in FIG. 8A, a semiconductor die 500 has conductive pillars 510, 512, 514, 516 affixed to its top surface. The conductive pillars may be formed on contact pads of semiconductor die 500, so as to provide electrical contact to the circuitry of semiconductor die 500. As discussed above, the height of conductive pillars 510, 512, 514, 516 establishes a thickness of a later-formed encapsulation layer. The conductive pillars are preferably formed of copper, but are not limited to copper. A typical pillar height may be in a range of 10 to 80 micrometers.

The conductive pillars may be formed by a conventional wafer bumping process, which involves electroplating of copper bumps. The process includes sputtering a seed layer, which may include TiW and Au, on the wafer. Then the wafer is coated with photoresist, a pattern including locations of the pillars is exposed, and the photoresist is developed to form openings which correspond to the locations of the conductive pillars. Then, copper is electroplated on the wafer in the photoresist openings. The photoresist is stripped from the wafer, and the seed layer is etched to leave copper pillars on the wafer.

Figure 8B:
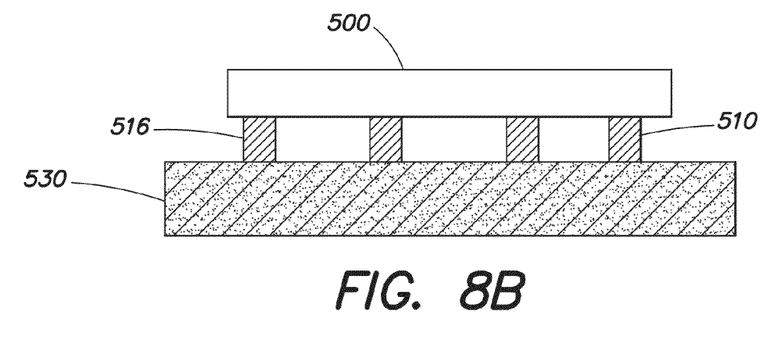

As shown in FIG. 8B, the semiconductor die 500 is mounted on a carrier tape 530 with its top surface facing downwardly toward carrier tape 530. As a result, the top surface of semiconductor die 500 is spaced from carrier tape 530 by the height of conductive pillars 510, 512, 514, 516.

Figure 8C:
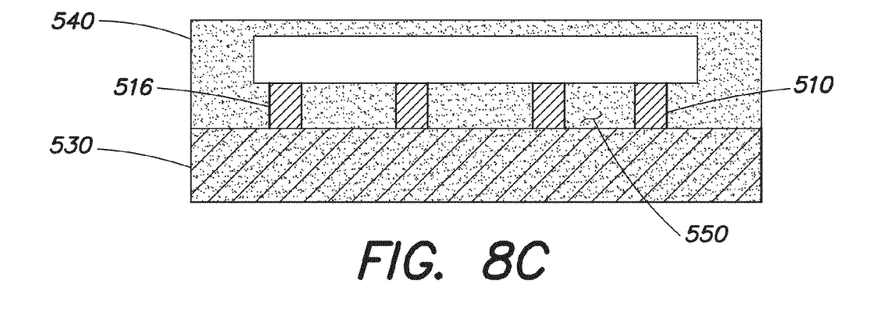

As shown in FIG. 8C, the semiconductor die 500 and the conductive pillars 510, 512, 514, 516 are encapsulated in a molded material 540. The molded material 540 may be a curable resin such as a mold compound. While a single semiconductor die is shown in FIG. 8C, an actual implementation may involve encapsulation of multiple semiconductor die, as shown in FIG. 1A, to form a reconstructed wafer. The reconstructed wafer is separated into individual semiconductor die assemblies after completion of processing. Following encapsulation of semiconductor die 500, the carrier tape 530 is removed. It may be noted that an encapsulation layer 550 is formed between carrier tape 530 and the top surface (facing downwardly in FIG. 8C) of semiconductor die 500.

Figure 8D:
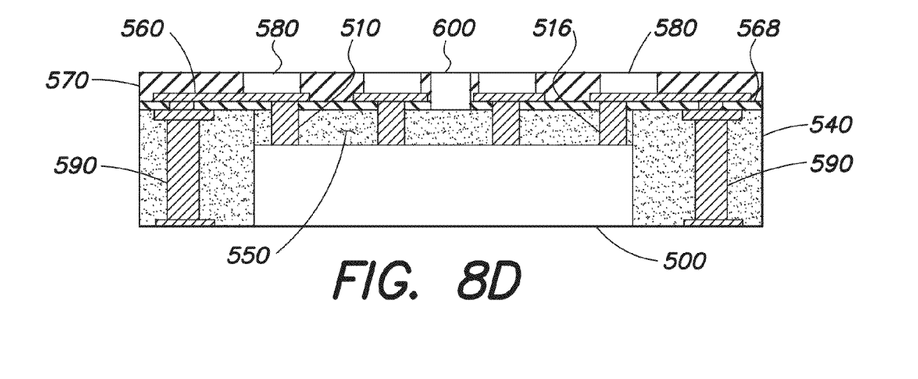

As shown in FIG. 8D, additional layers are formed on the top surface of the encapsulated semiconductor die. In particular, a first dielectric layer 568, a patterned metal layer 560 and a second dielectric layer 570 may be formed on the encapsulated semiconductor die, with the patterned metal layer 560 located between the first dielectric layer 568 and the second dielectric layer 570. Openings 580 in second dielectric layer 570 expose patterned metal layer 560 to permit electrical connections to patterned metal layer 560. Conductive vias 590 may be formed between the top and bottom surfaces of molded material 540. The patterned metal layer 560 may interconnect conductive pillars 510, 512, 514, 516, components mounted within the chambers of the electronic assembly and conductive vias 590, according to a desired circuit configuration. For example, these elements provide electrical connection between semiconductor die 500 and optical elements 330, 332 (FIG. 7) and between semiconductor die 500 and external circuitry (not shown).

FIG. 8D further illustrates an opening 600 in dielectric layers 568 and 570. The opening 600 may extend to the top surface of encapsulation layer 550 and may be located between first and second chambers of a later-mounted enclosure. The opening 600 is dimensioned and located to receive a wall between the first and second chambers of the electronics assembly. The opening 600 may be formed by a photolithographic patterning process.

FIGS. 9A-9E illustrate a process for making a semiconductor die assembly in accordance with further embodiments. The process of FIGS. 9A-9E differs from the process of FIGS. 8A-8D in that the encapsulation layer of the semiconductor die assembly is formed separately from encapsulation of the semiconductor die in the molded material. Like elements in FIGS. 8A-8D and FIGS. 9A-9E have the same reference numerals.

Figure 9A:
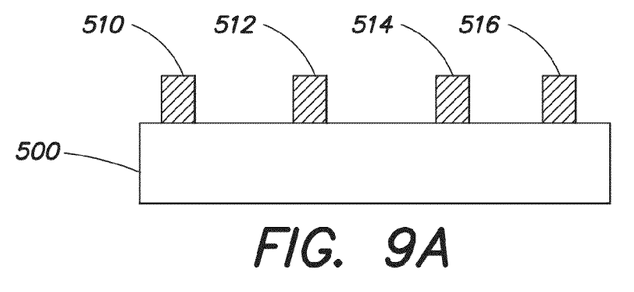
FIGS. 9A-9E illustrate a process for making a semiconductor die assembly in accordance with further embodiments.
Figure 9B:
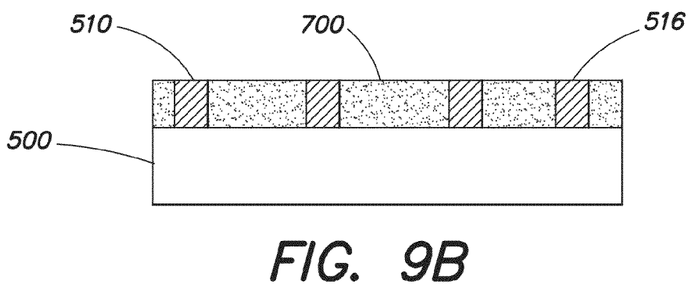

As shown in FIG. 9A, semiconductor die 500 has conductive pillars 510, 512, 514, 516 affixed to its top surface. As shown in FIG. 9B, an encapsulation layer 700 is formed on the top surface of the reconstructed wafer (FIG. 1B). The thickness of the encapsulation layer 700 may be slightly less than the height of conductive pillars 510, 512, 514, 516. The encapsulation layer 700 is formed over the entire top surface of semiconductor die 500, except for the areas occupied by the conductive pillars. The encapsulation layer 700 may be a molded material, such as a curable resin. The encapsulation layer 700 surrounds the conductive pillars and is in contact with the conductive pillars, so as to avoid light leakage along the conductive pillars. A planarization step, such as a wafer grinding process or chemical-mechanical polishing (CMP), may be used to expose conductive pillars 510, 512, 514, 516.

Figure 9C:
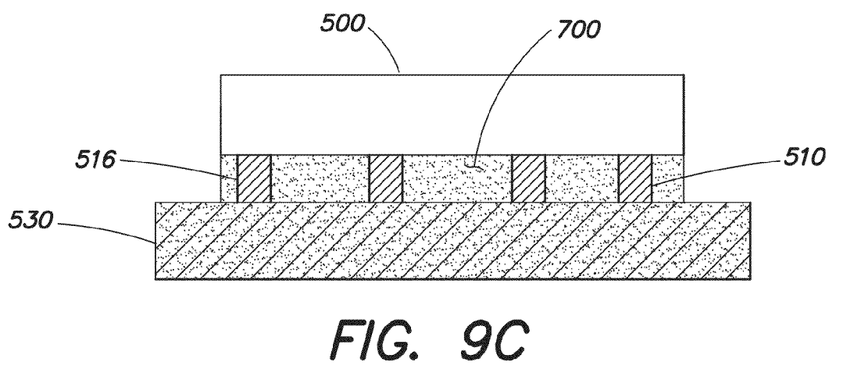

The reconstructed wafer is cut by a conventional dicing process into individual semiconductor die. Then, as shown in FIG. 9C, the semiconductor die 500 is mounted on carrier tape 530 with its top surface facing downwardly toward carrier tape 530. As a result, the top surface of semiconductor die 500 is spaced from carrier tape 530 by encapsulation layer 700.

Figure 9D:
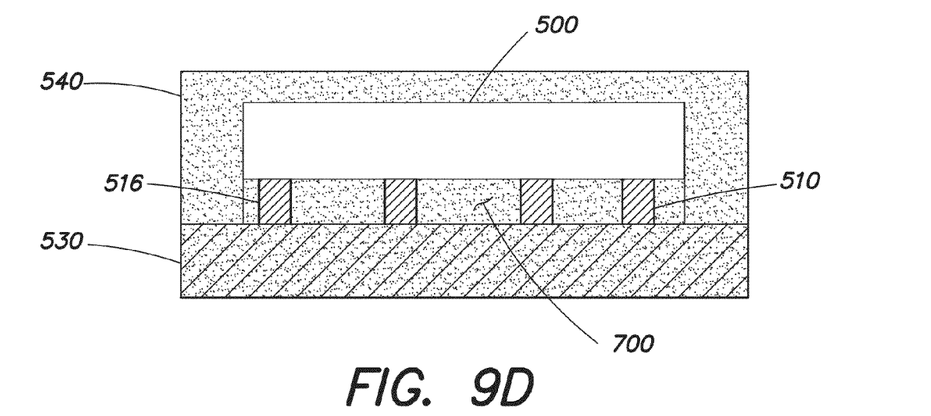

As shown in FIG. 9D, the semiconductor die 500 and the encapsulation layer 700 are encapsulated in molded material 540. As discussed above, the molded material 540 may be a curable resin such as a mold compound. The molded material 540 may be the same material as encapsulation layer 700 or a different material. After encapsulation of semiconductor die 500, the carrier tape 530 is removed. The semiconductor die 500 is thereby encapsulated by molded material 540 and encapsulation layer 700.

Figure 9E:
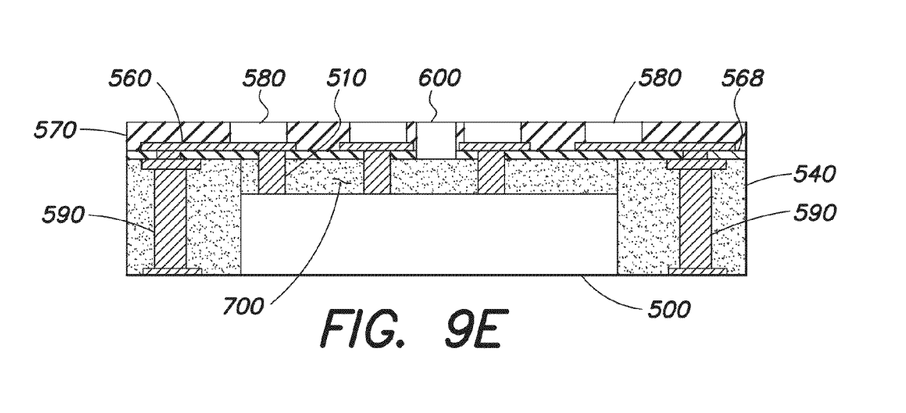

As shown in FIG. 9E, first dielectric layer 568, patterned metal layer 560, second dielectric layer 570, openings 580 and conductive vias 590 may be formed as discussed above in connection with FIG. 8D. In addition, opening 600 is formed in dielectric layers 568 and 570.

Following the process of FIGS. 8A-8D or the process of FIGS. 9A-9E, an enclosure, such as enclosure 320 shown in FIGS. 6 and 7 and described above, is formed over the semiconductor die assembly. The enclosure 320 may be a module, including outer wall 328, dividing wall 326 and lens 340, 342. The enclosure 320 is attached to semiconductor die assembly 310 by adhesive glue 434. As discussed above, the adhesive glue 434 is an opaque material that blocks light in the operating wavelength range of the electronics assembly. The enclosure 320 defines first and second chambers 322, 324 above respective first and second portions of the semiconductor die. The encapsulation layer 550 or 700 blocks light leakage between the first and second chambers.

Having thus described at least one illustrative embodiment of the invention, various alterations, modifications and improvements will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An electronics assembly comprising:
   a semiconductor die assembly, comprising:
   a semiconductor die encapsulated in a molded material;
   one or more conductive pillars on a top surface of the semiconductor die;
   an encapsulation layer located over the top surface of the semiconductor die and surrounding the conductive pillars; and
   at least one patterned metal layer and at least one dielectric layer over the encapsulation layer;
   an enclosure affixed to the semiconductor die assembly, the enclosure defining first and second chambers over the semiconductor die assembly and including a wall between the first and second chambers;
   first and second optical elements mounted in the first and second chambers, respectively, and electrically connected to the semiconductor die; and
   wherein the encapsulation layer blocks optical crosstalk between the first and second chambers.

2. An electronics assembly as defined in claim 1, wherein the molded material and the encapsulation layer are formed of the same material.

3. An electronics assembly as defined in claim 1, wherein the molded material and the encapsulation layer are formed of different materials.

4. An electronics assembly as defined in claim 1, wherein the conductive pillars have a pillar height above the top surface of the semiconductor die and wherein the encapsulation layer has a thickness equal to the pillar height.

5. An electronics assembly as defined in claim 1, wherein the first and second optical elements are electrically connected to the semiconductor die by the conductive pillars.

6. An electronics assembly as defined in claim 1, wherein the first optical element comprises a light source and the second optical element comprises a light sensor.

7. An electronics assembly as defined in claim 6, wherein the semiconductor die comprises an image sensor processor.

8. An electronics assembly as defined in claim 1, wherein the enclosure includes a first lens positioned over the first optical element and a second lens positioned over the second optical element.

9. An electronics assembly as defined in claim 1, wherein a first portion of the semiconductor die is located under the first chamber and a second portion of the semiconductor die is located under the second chamber.

10. An electronics assembly as defined in claim 1, wherein the semiconductor die assembly further includes conductive vias through the molded material for electrically connecting front and rear surfaces of the molded material.

11. An electronics assembly as defined in claim 1, wherein the wall between the first and second chambers extends into an opening in the dielectric layer.

12. An electronics assembly as defined in claim 1, wherein the encapsulation layer is formed of a material that blocks light in an operating wavelength range of the electronics assembly.

13. An electronics assembly as defined in claim 1, wherein the enclosure is affixed to the semiconductor die assembly by an opaque adhesive that extends over an outer edge of the dielectric layer.

14. The electronics assembly as defined in claim 1, wherein the semiconductor die comprises a transparent passivation layer and the encapsulation layer blocks light from reaching the transparent passivation layer.

15. A semiconductor die assembly comprising:
a semiconductor die having a transparent passivation layer and being encapsulated in a molded material;
one or more conductive pillars on a top surface of the semiconductor die;
an encapsulation layer located on the top surface of the semiconductor die and surrounding the conductive pillars;
at least one patterned metal layer and at least one dielectric layer over the encapsulation layer; and
wherein the encapsulation layer blocks light from reaching the transparent passivation layer.

16. A semiconductor die assembly as defined in claim 15, wherein the conductive pillars have a pillar height above the top surface of the semiconductor die and wherein the encapsulation layer has a thickness equal to the pillar height.

17. A semiconductor die assembly as defined in claim 15, further comprising conductive vias through the molded material for electrically connecting front and rear surfaces of the molded material.

18. A semiconductor die assembly as defined in claim 15, wherein the encapsulation layer is formed of a material that blocks light in an operating wavelength range of the semiconductor die assembly.

* * * * *